United States Patent
Do et al.

(10) Patent No.: US 7,205,651 B2
(45) Date of Patent: Apr. 17, 2007

(54) THERMALLY ENHANCED STACKED DIE PACKAGE AND FABRICATION METHOD

(75) Inventors: Byung Tai Do, Singapore (SG); Byung Hoon Ahn, Singapore (SG)

(73) Assignee: ST Assembly Test Services Ltd., Singapore (SG)

( * ) Notice: Subject to any disclaimer, the term of this patent is extended or adjusted under 35 U.S.C. 154(b) by 0 days.

(21) Appl. No.: 10/825,910

(22) Filed: Apr. 16, 2004

(65) Prior Publication Data

US 2005/0230800 A1    Oct. 20, 2005

(51) Int. Cl.
*H01L 23/34* (2006.01)

(52) U.S. Cl. ............... 257/706; 257/686; 257/707; 257/777; 257/796; 257/E23.102

(58) Field of Classification Search ......... 257/706, 257/686, 707, 777, 796
See application file for complete search history.

(56) References Cited

U.S. PATENT DOCUMENTS

| | | | |
|---|---|---|---|
| 4,496,965 A | 1/1985 | Orcutt et al. | |
| 4,868,712 A | 9/1989 | Woodman | |
| 5,854,511 A * | 12/1998 | Shin et al. | 257/713 |
| 5,904,497 A * | 5/1999 | Akram | 438/106 |
| 6,222,259 B1 | 4/2001 | Park et al. | |
| 6,351,028 B1 * | 2/2002 | Akram | 257/686 |
| 6,410,988 B1 | 6/2002 | Caletka et al. | |
| 6,413,353 B2 | 7/2002 | Pompeo et al. | |
| 6,437,984 B1 * | 8/2002 | Chiu et al. | 361/704 |
| 6,507,104 B2 * | 1/2003 | Ho et al. | 257/712 |
| 6,627,990 B1 | 9/2003 | Shim et al. | |
| 6,737,750 B1 * | 5/2004 | Hoffman et al. | 257/777 |
| 6,818,978 B1 * | 11/2004 | Fan | 257/686 |
| 2003/0034569 A1 | 2/2003 | Caletka et al. | |
| 2004/0183180 A1* | 9/2004 | Chung et al. | 257/686 |

* cited by examiner

*Primary Examiner*—Tu-Tu Ho
(74) *Attorney, Agent, or Firm*—Mikio Ishimaru

(57) ABSTRACT

A substrate is provided. A first die is attached to the substrate. The first die is electrically connected to the substrate. A heat sink having an undercut around its periphery is attached to the first die. A second die is attached to the heat sink. The second die is electrically connected to the substrate, and the first die, the heat sink, and the second die are encapsulated.

20 Claims, 4 Drawing Sheets

THERMALLY ENHANCED STACKED DIE PACKAGE AND FABRICATION METHOD

TECHNICAL FIELD

The present invention relates generally to semiconductor packages having stacked dies, and more particularly to a method and apparatus for manufacturing a thermally enhanced stacked die semiconductor package.

BACKGROUND ART

Semiconductors, or computer chips, have made their way into virtually every electrical product manufactured today. Chips are used not only in very sophisticated industrial and commercial electronic equipment, but also in many household and consumer items such as televisions, clothes washers and dryers, radios and telephones. As many of these types of products become smaller but more functional, there is a need to include more semiconductors in these smaller products. The reduction in size of cellular telephones is one example of how more and more capabilities find their way into smaller and smaller electronic products.

The popularity of smaller and more complicated electronic products has placed increased demands on the packaging for chips used in such devices. These increased demands have led to new packaging concepts and approaches. Unpackaged chips are referred to as die or dies, and current packaging methods include placing more than one die in a single package. One such approach is to stack one die on top of another and then enclose the stack of dies in one package. The final package for the multiple-stacked semiconductor dies is much smaller than would result if the dies each were packaged separately. In addition to providing a smaller size, these packages offer a number of advantages that relate to the manufacturing of the package such as ease of handling and assembling.

An example of a die stacking technique incorporates a pair of stacked dies encapsulated in a molded plastic package that has connectors or leads extending out from the package that function as input/output terminals of the dies inside the package. The package includes a substrate and a first die mounted on the top surface of the substrate. A second die is then stacked on top of the first die.

The substrate may be comprised of a flexible resin tape, a rigid fiber-glass/copper sheet laminate, a co-fired ceramic coupon, or a flexible metal lead frame, a ball grid array substrate or other well-known types of substrates in the semiconductor industry, depending on the particular type of semiconductor package being used.

The first die is conventionally mounted to the top surface of the substrate with, for example, a layer of an adhesive or an adhesive film, and then electrically connected to the substrate by a plurality of fine, conductive wires, typically gold (Au) or aluminum (Al), that electrically connects the die to the substrate. The wires are attached to the die at the bonding pads of the die, which are located around the periphery of the die.

The second die is mounted on the top surface of the first die with an adhesive layer that is positioned within the central area of the top surface of the first die. The adhesive layer may contact or cover both the bonding pads of the first die and the conductive wires bonded to the first die. The adhesive layer positions the second die sufficiently far above the first die to prevent the dies from contacting each other or any wires connected to the dies. The second die is then wire bonded to the substrate in the same fashion as the first die. One or more additional dies can then be stacked on top of the second die using the same technique.

In a stacked die arrangement, the dies are wire bonded sequentially, typically with automated wire bonding equipment employing well-known thermal-compression or ultrasonic wire bonding techniques. During the wire bonding process, the head of a wire bonding apparatus applies a downward pressure on a conductive wire held in contact with a wire-bonding pad on the die to weld or bond the wire to the bonding pad on the die.

After the dies are wire bonded to the substrate, the dies, substrate, and conductive wires are covered with plastic, or other suitable material, which encapsulates the stacked dies and protects them from moisture and other environmental elements.

Despite efforts to overcome problems resulting in lower yields of semiconductor packages with stacked dies problems still exist. In particular, dies within the stack fail prematurely.

In conventional multi-chip modules, by packing a number of dies in close proximity within a single package, thereby eliminating individual packages for each of the die, electrical performance is improved and the board space occupied by the semiconductor is reduced. Due to the increase in the packing density, however, the power density of the multi-chip module typically is higher than when each die is separately packaged, thus requiring more elaborate thermal design and thermal management schemes to maintain the device temperatures within acceptable ranges.

Consequently, there remains a need for improved, more economical, more efficient, and more readily manufactured and assembled heat sinks, heat sink packages, and fabrication methods for use with semiconductor packages.

Solutions to these problems have been long sought, but prior developments have not taught or suggested satisfactory solutions and, thus, solutions to these problems have long eluded those skilled in the art.

DISCLOSURE OF THE INVENTION

The present invention provides a semiconductor package including a substrate. A first die is attached to the substrate. The first die is electrically connected to the substrate. A heat sink having an undercut around its periphery is attached to the first die. A second die is attached to the heat sink. The second die is electrically connected to the substrate, and the first die, the heat sink, and the second die are encapsulated.

The present invention provides a thermally enhanced semiconductor package that is more economical, more efficient, and more readily manufactured and assembled.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
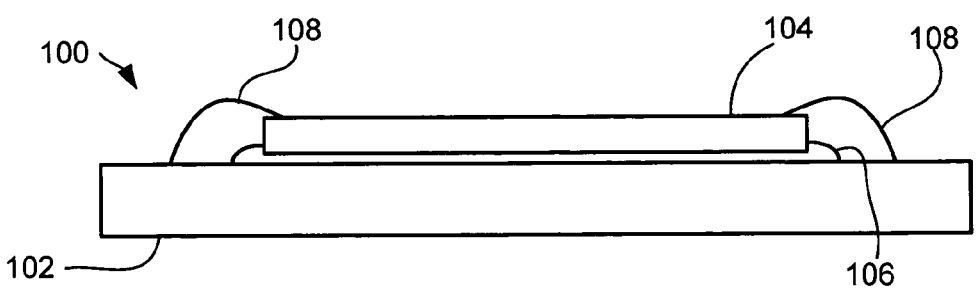
FIG. 1 is a side view of a semiconductor in an intermediate stage of manufacture with a substrate having a first die attached in accordance with an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail. Likewise, the drawings showing embodiments of the invention are semi-diagrammatic and not to scale and, particularly, some of the dimensions are for the clarity of presentation and are shown greatly exaggerated in the FIGs. Generally, the device can be operated in any orientation. In addition, where multiple embodiments are disclosed and described having some features in common, for clarity and ease of illustration and description thereof like features one to another will ordinarily be described with like reference numerals.

The term "horizontal" as used herein is defined as a plane parallel to the conventional plane or surface of the substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane. The term "processing" as used herein includes deposition of material or photoresist, patterning, exposure, development, etching, cleaning, and/or removal of the material or photoresist as required in forming a described structure.

Referring now to FIG. 1 therein is shown a side view of a semiconductor 100 in an intermediate stage of manufacture with a substrate 102 having a first die 104 attached in accordance with an embodiment of the present invention.

While the substrate 102 shown is a rigid sheet laminate, a wide variety of substrates could be used without departing from the scope of the present invention as described and claimed herein. For example, the substrate 102 could be a flexible resin tape or a flexible metal lead frame, or other suitable material.

A first adhesive layer 106 may be an adhesive tape or, as shown in FIG. 1, a liquid adhesive that can be applied with automated die attach equipment generally known in the industry. The first adhesive layer 106 can comprise a wide variety of known die attach adhesives, although it is desirable that the first adhesive layer 106 have a relatively high viscosity so it will remain in place on the upper surface of the substrate 102 during assembly of the semiconductor 100. A first number of bonding wires 108 is connected between the first die 104 and the substrate 102. The first number of bonding wires 108 typically used in packages of the type described herein are made of very fine wires of metals such as copper (Cu), aluminum (Al), or gold (Au). The first number of bonding wires 108 is wire bonded using conventional techniques such as ultrasonic bonding, compression bonding, soldering, or other suitable techniques.

Figure 2:
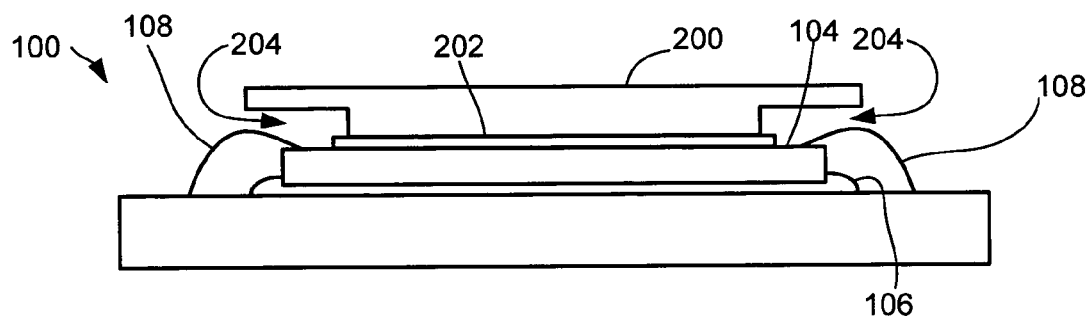
FIG. 2 is the structure of FIG. 1 with a heat sink attached to the first die.

Referring now to FIG. 2 therein is shown the structure of FIG. 1 with a heat sink 200 attached to the first die 104. The heat sink 200 is attached to the upper surface of the first die 104 using a second adhesive layer 202. The heat sink 200 has an undercut 204 around the periphery of the heat sink 200 so that an outer portion of the heat sink 200 extends laterally over the first number of bonding wires 108.

Accordingly, the heat sink 200 can provide support for an additional die that is larger than the first die 104 if necessary or desirable for a particular design. The thickness of the heat sink 200 can be adjusted to meet the needs of a wide variety of designs. For example, if the dies in a particular design generate a significant amount of heat during operation the heat sink 200 can be made thicker. If on the other hand a lesser amount of heat is generated, a heat sink 200 that is thinner can be used.

Additionally, the heat sink 200 provides protection for the first number of bonding wires 108 during subsequent wire bonding of a die or dies that are attached to the upper surface of the heat sink as discussed below.

Figure 3:
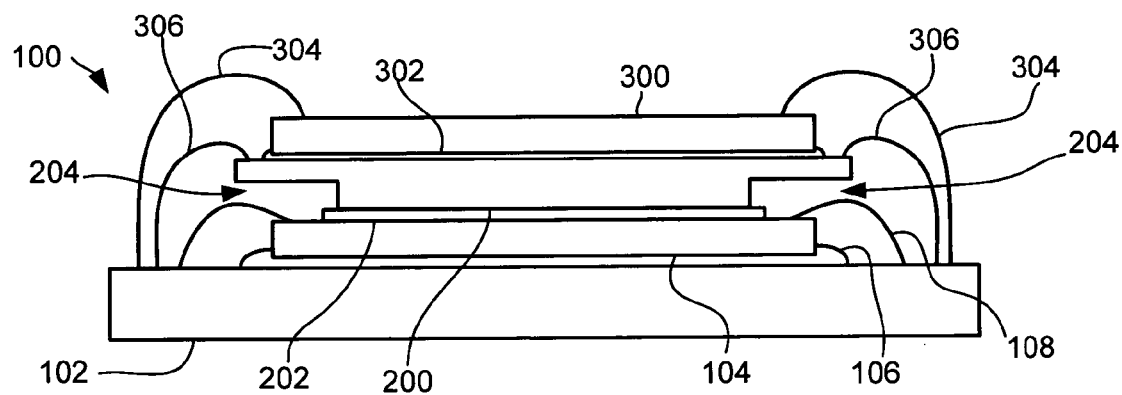
FIG. 3 is the structure of FIG. 2 with a second die attached to the heat sink forming a die stack.

Referring now to FIG. 3 therein is shown the structure of FIG. 2 with a second die 300 attached to the heat sink 200 forming a die stack. The heat sink 200 has a third adhesive layer 302 attached to the upper surface of the heat sink 200. Preferably, the first adhesive layer 106, and the second adhesive layer 202, and the third adhesive layer are a thermally conductive material. The second die 300 is attached to the upper surface of the heat sink by the third adhesive layer 302. The second die 300 can be smaller than, the same size as, or larger than the first die 104.

A second number of bonding wires 304 is connected between the second die 300 and the substrate 102. The second number of bonding wires 304 typically used in packages of the type described herein are made of very fine wires of metals such as copper (Cu), aluminum (Al), or gold (Au). The second number of bonding wires 304 is wire bonded using conventional techniques such as ultrasonic bonding, compression bonding, soldering, or other suitable techniques.

Additionally, a third number of bonding wires 306 can be used between the heat sink 200 and the substrate 102 to conduct heat away from the heat sink 200 to the substrate 102.

Figure 4:
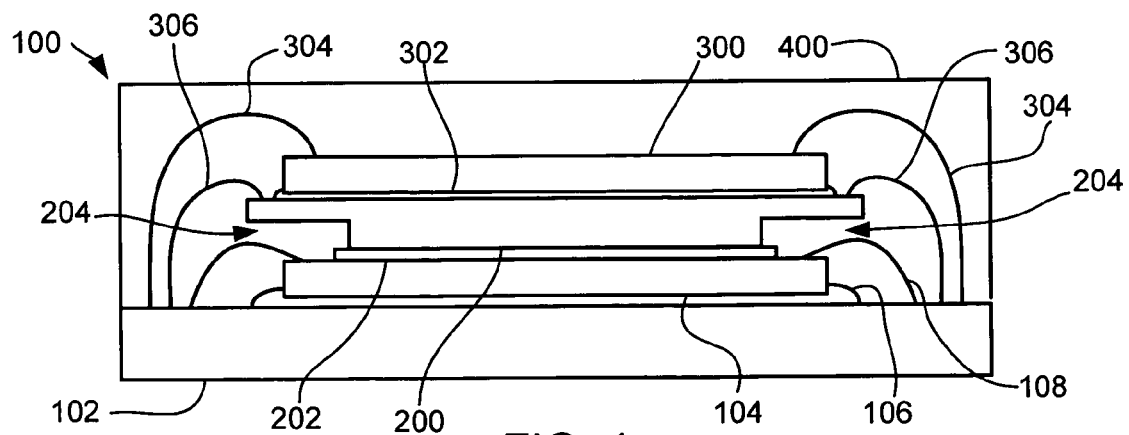
FIG. 4 is the structure of FIG. 3 after encapsulating the semiconductor.

Referring now to FIG. 4 therein is shown the structure of FIG. 3 after encapsulating the semiconductor 100. An encapsulant 400 is formed using conventional methods of mold formation and epoxy or plastic injection into the mold. Organic polymeric encapsulants such as thermoplastics, thermoset plastics, ceramics, and elastomers can be used. The encapsulant 400 reduces the likelihood that moisture or other impurities can reach the first die 104 or the second die 300 thereby enhancing reliability of the semiconductor 100.

It will be noted that the heat sink 200 also acts as a spacer between the first die 104 and the second die 300, and if properly sized prevents the second die 300 from contacting the first number of bonding wires 108 that connect the first die 104 to the substrate 102. Additionally, the heat sink 200 provides support for the second die 300 during wire bonding of the second number of bonding wires 304 between the second die 300 and the substrate 102. As previously discussed, the undercut 204 can be varied to accommodate the size of the second die 300. For example, if the second die 300 is larger than the first die 104, the undercut 204 can extend over the number of bonding wires 108. The undercut 204 also provides protection for the first number of bonding wires 108 during wire bonding of the second number of bonding wires 304.

Figure 5:
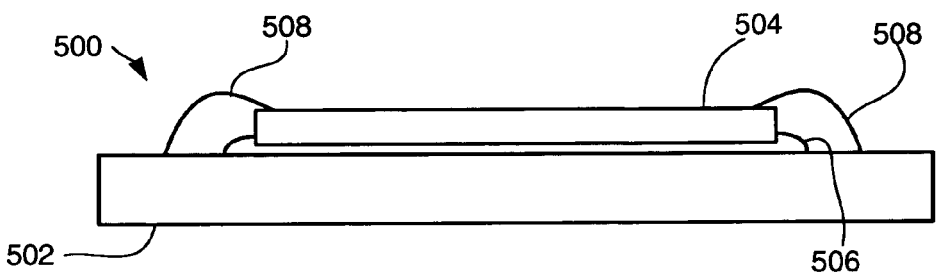
FIG. 5 is a side view of another embodiment of a semiconductor in an intermediate stage of manufacture with a substrate having a first die attached.

Referring now to FIG. 5 therein is shown a side view of another embodiment of a semiconductor 500 in an intermediate stage of manufacture with a substrate 502 having a first die 504 attached.

While the substrate 502 shown is a rigid sheet laminate, a wide variety of substrates could be used without departing from the scope of the present invention as described and claimed herein. For example, the substrate 502 could be a flexible resin tape or a flexible metal lead frame, or other suitable material.

A first adhesive layer 506 may be an adhesive tape or, as shown in FIG. 5, a liquid adhesive that can be applied with automated die attach equipment generally known in the industry. The first adhesive layer 506 can comprise a wide variety of known die attach adhesives, although it is desirable that the first adhesive layer 506 have a relatively high viscosity so it will remain in place on the upper surface of the substrate 502 during assembly of the semiconductor 500. A first number of bonding wires 508 is connected between the first die 504 and the substrate 502. The first number of bonding wires 508 typically used in packages of the type described herein are made of very fine wires of metals such as copper (Cu), aluminum (Al), or gold (Au). The first number of bonding wires 508 is wire bonded using conventional techniques such as ultrasonic bonding, compression bonding, soldering, or other suitable techniques.

Figure 6:
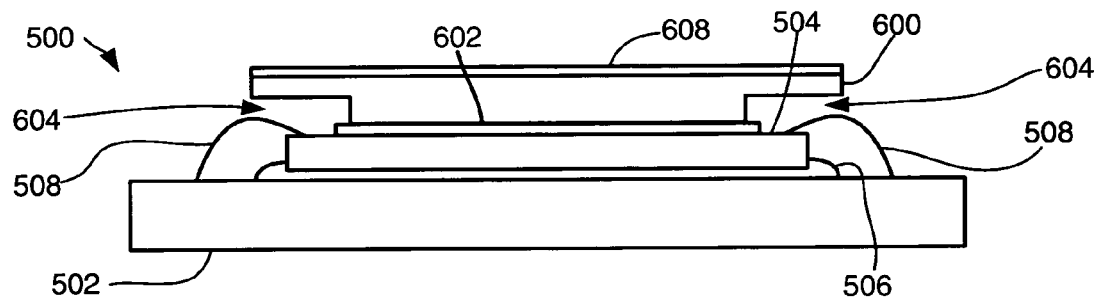
FIG. 6 is the structure of FIG. 5 with a heat sink attached to the first die and connected to the substrate.

Referring now to FIG. 6 therein is shown the structure of FIG. 5 with a heat sink 600 attached to the first die 504. The heat sink 600 is attached to the upper surface of the first die 504 using a second adhesive layer 602. The heat sink 600 has an undercut 604 around the periphery of the heat sink 600 so that an outer portion of the heat sink 600 extends laterally over the first number of bonding wires 508.

Accordingly, the heat sink 600 can provide support for a die that is larger than the first die 504 if necessary or desirable for a particular design. The heat sink 600 has a path to a ground plane 610 formed, for example, by providing an electrically conductive material layer 608 on its surface, such as by plating the electrically conductive material onto the heat sink 600.

In the embodiment shown in FIGS. 5–8, the heat sink 600 has an electrically conductive material layer 608 that is formed, for example, by plating an electrically conductive material, such as silver, on the surface of the heat sink 600. The heat sink 600 therefore can provide a ground plane for the second die 700 if necessary for a particular design.

Accordingly, the heat sink 600 can provide support for an additional die that is larger than the first die 504 if necessary or desirable for a particular design. The thickness of the heat sink 600 can be adjusted to meet the needs of a wide variety of designs. For example, if the dies in a particular design generate a significant amount of heat during operation the heat sink 600 can be made thicker. If on the other hand a lesser amount of heat is generated, a heat sink 600 that is thinner can be used.

Additionally, the heat sink 600 provides protection for the first number of bonding wires 108 during subsequent wire bonding of a die or dies that are attached to the upper surface of the heat sink as discussed below.

Figure 7:
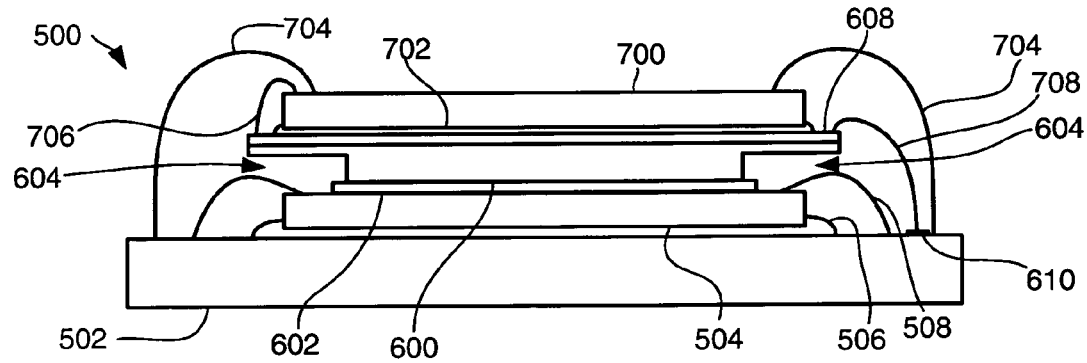
FIG. 7 is the structure of FIG. 6 with a second die attached to the heat sink forming a die stack.

Referring now to FIG. 7 therein is shown the structure of FIG. 6 with a second die 700 attached to the heat sink 600 forming a die stack. The heat sink 600 has a third adhesive layer 702 attached to the upper surface of the heat sink 600. Preferably, the first adhesive layer 506, and the second adhesive layer 602, and the third adhesive layer are a thermally conductive material. The second die 700 is attached to the upper surface of the heat sink 600 by the third adhesive layer 702. The second die 700 can be smaller than, the same size as, or larger than the first die 504.

A second number of bonding wires 704 is connected between the second die 700 and the substrate 502. The second number of bonding wires 704 typically used in packages of the type described herein are made of very fine wires of metals such as copper (Cu), aluminum (Al), or gold (Au). The second number of bonding wires 704 is wire bonded using conventional techniques such as ultrasonic bonding, compression bonding, soldering, or other suitable techniques.

A first ground wire 706 is connected between the second die 700 and the electrically conductive material layer 608 on heat sink 600. The electrically conductive material layer 608, in turn, is connected to the ground plane 610 on the substrate 502 by a second ground wire 708. The second die 700 therefore is electrically connected to the ground plane 610 on the substrate 502 through the first ground wire 706, the electrically conductive material layer 608, and the second ground wire 708. The first ground wire 706 and the second ground wire 708 also provide a path for heat to be conducted away from the heat sink 600 to the substrate 502.

Figure 8:
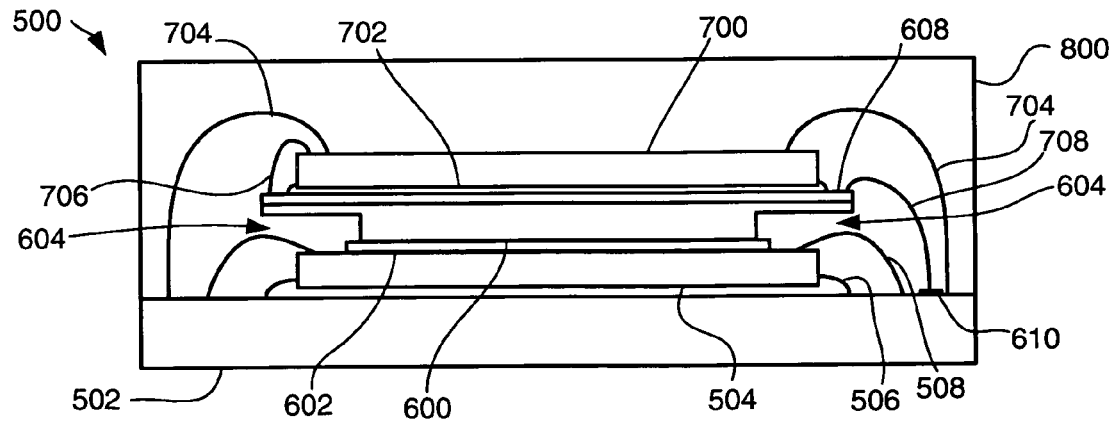
FIG. 8 is the structure of FIG. 7 after covering the die stack with an encapsulating material to form a semiconductor.

Referring now to FIG. 8 therein is shown the structure of FIG. 7 after encapsulating the semiconductor 500. An encapsulant 800 is formed using conventional methods of mold formation and epoxy or plastic injection into the mold. Organic polymeric encapsulants such as thermoplastics, thermoset plastics, ceramics, and elastomers can be used. The encapsulant 800 reduces the likelihood that moisture or other impurities can reach the first die 504 or the second die 700 thereby enhancing reliability of the semiconductor 500.

It will be noted that the heat sink 600 also acts as a spacer between the first die 504 and the second die 700, and if properly sized prevents the second die 700 from contacting the first number of bonding wires 508 that connect the first die 504 to the substrate 502. Additionally, the heat sink 600 provides support for the second die 700 during wire bonding of the second number of bonding wires 704 between the second die 700 and the substrate 502. As previously discussed, the undercut 604 can be varied to accommodate the size of the second die 700. For example, if the second die 700 is larger than the first die 504, the undercut 604 can extend over the number of bonding wires 508. The undercut 604 also provides protection for the first number of bonding wires 508 during wire bonding of the second number of bonding wires 704.

Figure 9:
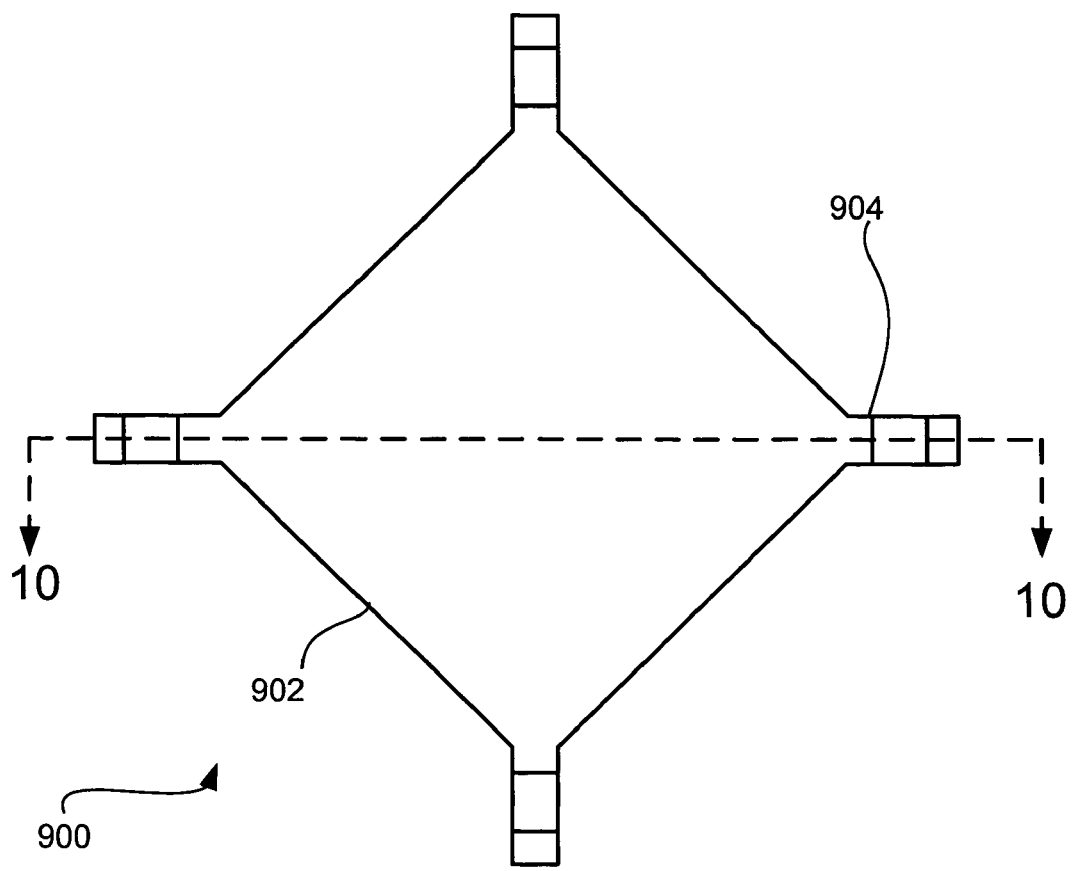
FIG. 9 is a plan view of one embodiment of a heat sink.

Referring now to FIG. 9 therein is shown is a plan view of one example of a heat sink 900 that can be used in accordance with the present invention. The heat sink 900 is representative of the heat sink 200 shown in FIGS. 2–4, and the heat sink 600 shown in FIGS. 6–8. The heat sink 900 has a body portion 902 and a number of legs 904 located at each corner of the body portion 902 for attachment of the heat sink 900 to a substrate, such as the substrate 102 shown in FIG. 1 or the substrate 502 shown in FIG. 5. If the heat sink 900 is to be used as an electrical ground connection, the heat sink 900 can be attached to a substrate using an electrically conductive adhesive, such as silver epoxy. Additionally, the heat sink 900 may be plated as described in connection with the embodiment shown in FIGS. 5–8 above.

Figure 10:
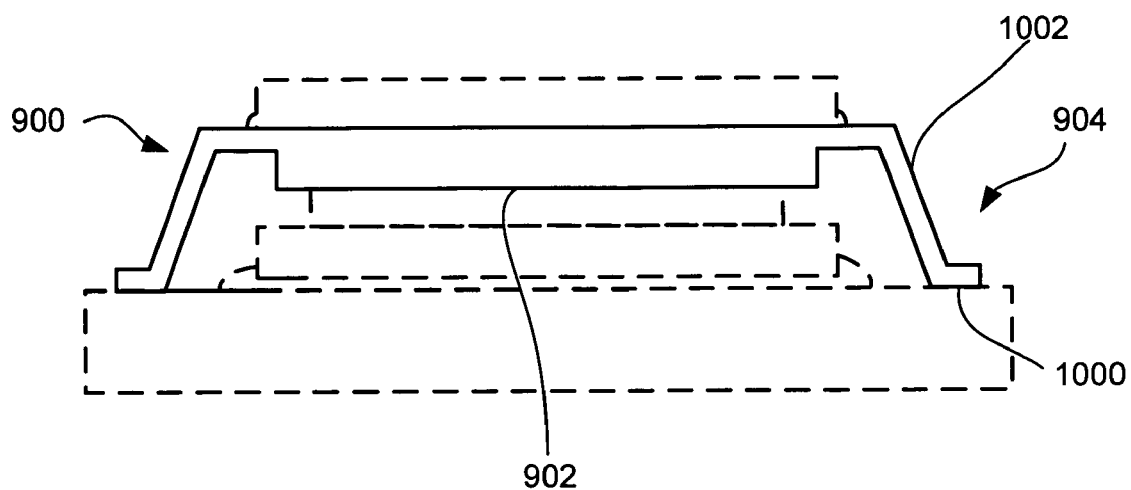
FIG. 10 is a cross-sectional view of the structure of FIG. 9 taken along line 10—10.

Referring now to FIG. 10 therein is shown a cross-sectional view of the structure of FIG. 9 taken along line 10—10. Each of the number of legs 904 of the heat sink 900 includes a base 1000 and a support 1002. The support 1002 connects the base 1000 to the body portion 902. The support can be sized to accommodate the height of the die that is positioned under the heat sink 900, such as the first die 104 shown in FIG. 1, or the first die 504 shown in FIG. 5.

Figure 11:
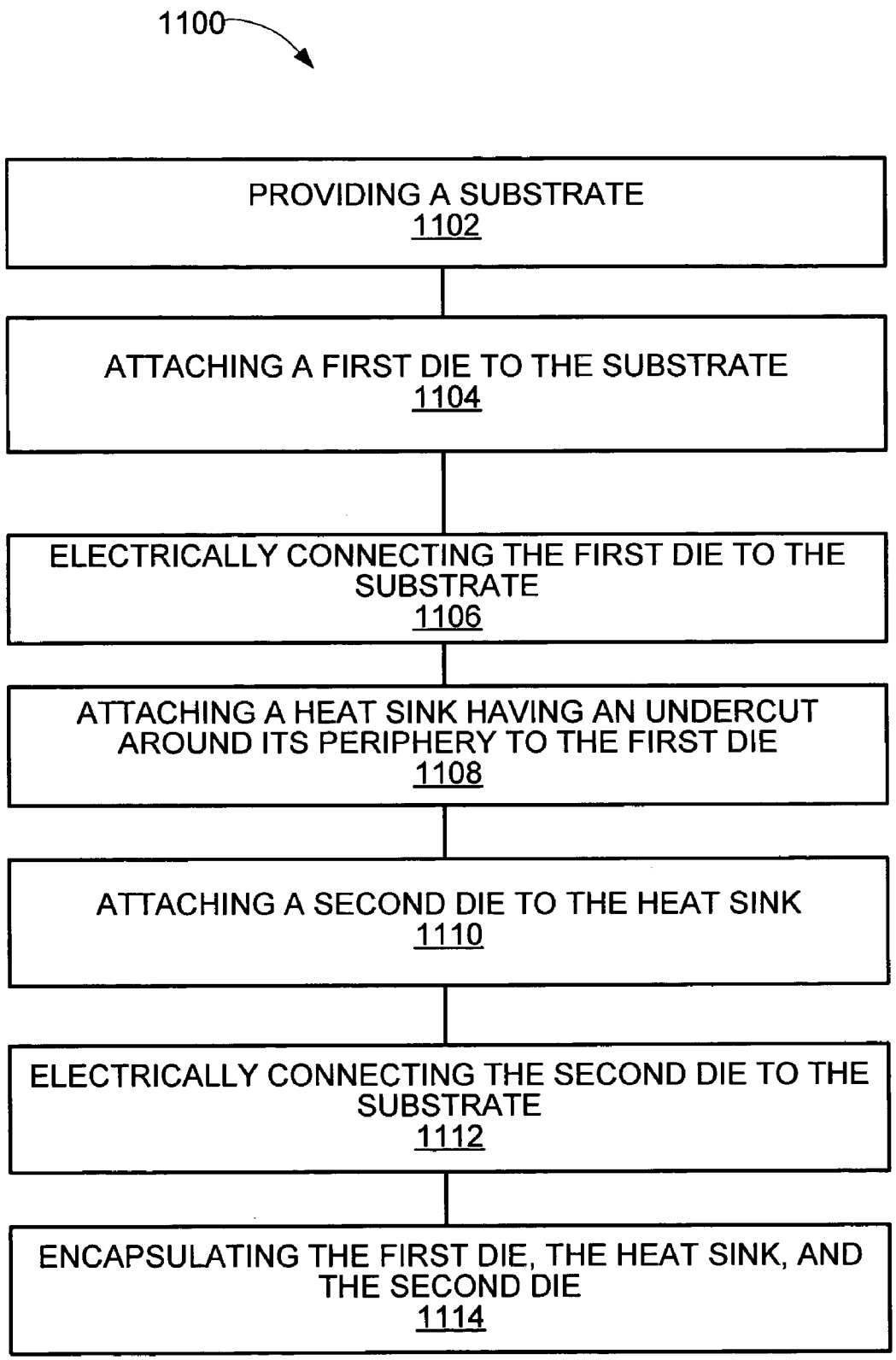
FIG. 11 is a flow chart of a method for in accordance with an embodiment of the present invention.

A substrate, and die stack are shown in phantom lines in FIG. 10 to show the relationship of the heat sink 900 to the other components of a semiconductor package in FIG. 10. The substrate and die stack can include, for example, the substrate 102, the first die 104, and the second die 300 shown in FIGS. 1–4, or the substrate 502, the first die 504 and the second die 700, shown in FIGS. 5–8, Referring now to FIG. 11 therein is shown the steps of a method 1100 of the present invention. The method 1100 of assembling a semiconductor package with stacked dies comprises providing a substrate in a block 1102; attaching a first die to the substrate in a block 1104; electrically connecting the first die to the substrate in a block 1106; attaching a heat sink having an undercut around its periphery to the first die in a block 1108; attaching a second die to the heat sink in a block 1110; electrically connecting the second die to the substrate in a block 1112; and encapsulating the first die, the heat sink, and the second die in a block 1114.

Thus, it has been discovered that the method and apparatus of the present invention furnish important and heretofore unavailable solutions, capabilities, and functional advantages for manufacturing thermally enhanced semiconductors with stacked dies. The resulting process and configurations are straightforward, economical, uncomplicated, highly versatile, and effective, use conventional technologies, and are thus readily suited for manufacturing such devices and are fully compatible with conventional manufacturing processes and technologies.

It will be apparent to those skilled in the art that, although the present invention has been described with reference to a semiconductor having two dies, additional dies may be added to the semiconductor without departing from the scope of the present invention.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters set forth herein or shown in the accompanying drawings are to be interpreted in an illustrative and non-limiting sense.

The invention claimed is:

1. A method of assembling a semiconductor package with stacked dies comprising:
   providing a substrate;
   attaching a first die to the substrate;
   electrically connecting the first die to the substrate;
   attaching a heat sink to the first die;
   electrically connecting the heat sink to the substrate using a number of bonding wires;
   the heat sink comprising a body portion, an undercut portion around a periphery thereof, and a plurality of legs integrally formed with the undercut portion;
   attaching the plurality of legs to the substrate;
   attaching a second die to the heat sink;
   electrically connecting the second die to the substrate; and
   encapsulating the first die, the heat sink, and the second die.

2. The method of assembling a semiconductor package with stacked dies as claimed in claim 1 wherein:
   electrically connecting the first die to the substrate uses a number of bonding wires; and
   attaching a heat sink attaches a heat sink that extends laterally over the number of bonding wires.

3. The method of assembling a semiconductor package with stacked dies as claimed in claim 1 wherein attaching a heat sink attaches a heat sink that is electrically grounded.

4. The method of assembling a semiconductor package with stacked dies as claimed in claim 1 wherein attaching a heat sink attaches a heat sink that has an electrically conductive coating, further comprising:
   connecting the second die to the electrically conductive coating; and
   connecting the electrically conductive coating to a ground plane.

5. The method of assembling a semiconductor package with stacked dies as claimed in claim 1 wherein attaching a heat sink attaches a heat sink that extends laterally beyond the edges of the second die.

6. A method of thermally enhancing a semiconductor package with a stack of dies comprising providing a heat sink between dies in the stack, the heat sink having bonding wires to a ground connection in a substrate; the heat sink having a body portion, an undercut portion around a periphery thereof, a plurality of legs integrally formed with the undercut portion, and electrically connected using a number of bonding wires to the stack of dies.

7. The method of thermally enhancing a semiconductor package with a stack of dies as claimed in claim 6 wherein:
   providing a heat sink attaches a heat sink that extends laterally over the lower die to which the heat sink is attached.

8. The method of thermally enhancing a semiconductor package with a stack of dies as claimed in claim 6 wherein providing a heat sink attaches a heat sink that is electrically grounded.

9. The method of thermally enhancing a semiconductor package with a stack of dies as claimed in claim 6 wherein providing a heat sink attaches a heat sink that has an electrically conductive coating, further comprising:
   connecting one of the dies in the stack of dies to the electrically conductive coating; and
   connecting the electrically conductive coating to a ground plane.

10. The method of thermally enhancing a semiconductor package with a stack of dies as claimed in claim 6 wherein providing a heat sink attaches a heat sink between each adjoining pair of dies in the stack of dies.

11. A semiconductor package with stacked dies comprising:
    a substrate;
    a first die attached to the substrate;
    the first die being electrically connected to the substrate;
    a heat sink attached to the first die;
    a number of bonding wires electrically connecting the heat sink to the substrate;
    the heat sink having a body portion, an undercut portion around a periphery thereof, and a plurality of legs integrally formed with the undercut portion;
    the plurality of legs attached to the substrate;
    a second die attached to the heat sink and electrically connected to the substrate; and an encapsulant over the first die, the heat sink, and the second die.

12. The semiconductor package with stacked dies as claimed in claim 11 further comprising:
a number of bonding wires electrically connecting the first die to the substrate; and wherein:
the undercut of the heat sink extends laterally over the number of bonding wires.

13. The semiconductor package with stacked dies as claimed in claim 11 wherein the heat sink is electrically grounded.

14. The semiconductor package with stacked dies as claimed in claim 11 wherein:
the heat sink has an electrically conductive coating connected to a ground plane on the substrate; and
the second die is connected to the electrically conductive coating.

15. The semiconductor package with stacked dies as claimed in claim 11 wherein the undercut of the heat sink extends laterally beyond the edges of the second die.

16. A thermally enhanced semiconductor package with a stack of dies comprising:
a heat sink between dies in the stack;
the heat sink having a body portion, an undercut portion around a periphery thereof, and a plurality of legs integrally formed with the undercut and a plurality of legs integrally formed with the undercut portion;
a number of bonding wires electrically connecting the heat sink to the dies in the stack;
a substrate having a ground connection; and
a number of bonding wires electrically connecting the heat sink to the ground connection.

17. The thermally enhanced semiconductor package with a stack of dies as claimed in claim 16 wherein:
the undercut of the heat sink extends laterally over the die to which the heat sink is attached.

18. The thermally enhanced semiconductor package with a stack of dies as claimed in claim 16 wherein the heat sink is electrically grounded.

19. The thermally enhanced semiconductor package with a stack of dies as claimed in claim 16 wherein:
the heat sink has an electrically conductive coating;
one of the dies in the stack of dies is connected to the electrically conductive coating; and
the electrically conductive coating is connected to a ground plane.

20. The thermally enhanced semiconductor package with a stack of dies as claimed in claim 16 wherein a heat sink is positioned between each adjoining pair of dies in the stack of dies.

* * * * *

UNITED STATES PATENT AND TRADEMARK OFFICE
CERTIFICATE OF CORRECTION

| | | |
|---|---|---|
| PATENT NO. | : 7,205,651 B2 | Page 1 of 1 |
| APPLICATION NO. | : 10/825910 | |
| DATED | : April 17, 2007 | |
| INVENTOR(S) | : Do et al. | |

It is certified that error appears in the above-identified patent and that said Letters Patent is hereby corrected as shown below:

Column 9, beginning on line 26 and ending on line 27, delete "and a plurality of legs integrally formed with the undercut"

Signed and Sealed this

Fourteenth Day of August, 2007

JON W. DUDAS
*Director of the United States Patent and Trademark Office*